US010206282B2

(12) United States Patent
Teo

(10) Patent No.: US 10,206,282 B2
(45) Date of Patent: Feb. 12, 2019

(54) DEVICE HAVING A SINGLE-SIDED PRINTED CIRCUIT BOARD

(71) Applicant: Home Control Singapore PTE. LTD., Singapore (SG)

(72) Inventor: Eng Kim Teo, Singapore (SG)

(73) Assignee: Home Control Singapore PTE. LTD., New Tech Park (SG)

( * ) Notice: Subject to any disclaimer, the term of this patent is extended or adjusted under 35 U.S.C. 154(b) by 15 days.

(21) Appl. No.: 15/328,322

(22) PCT Filed: Aug. 24, 2015

(86) PCT No.: PCT/SG2015/000137
§ 371 (c)(1),
(2) Date: Jan. 23, 2017

(87) PCT Pub. No.: WO2016/032395
PCT Pub. Date: Mar. 3, 2016

(65) Prior Publication Data
US 2017/0215283 A1 Jul. 27, 2017

(30) Foreign Application Priority Data
Aug. 25, 2014 (EP) .................................. 14182073

(51) Int. Cl.
H05K 1/00 (2006.01)
H05K 1/18 (2006.01)
(Continued)

(52) U.S. Cl.
CPC ........... *H05K 1/116* (2013.01); *H05K 1/0268* (2013.01); *G08C 17/02* (2013.01); *H05K 3/365* (2013.01);
(Continued)

(58) Field of Classification Search
CPC . G08C 17/02; H05K 1/116; H05K 2201/0394
See application file for complete search history.

(56) References Cited

U.S. PATENT DOCUMENTS 4,701,579 A * 10/1987 Kurachi ............... H01H 13/702
200/5 A
5,514,842 A * 5/1996 Sugii .................... H01H 13/702
200/5 A
(Continued)

FOREIGN PATENT DOCUMENTS

DE 2827640 A1 1/1980
EP 0 852 397 A1 7/1998
(Continued)

OTHER PUBLICATIONS

Extended European Search Report for European Application No. 14182073.8 "Device having a single-sided printed circuit board," dated Feb. 25, 2015.
(Continued)

*Primary Examiner* — Yuriy Semenenko
(74) *Attorney, Agent, or Firm* — Hamilton, Brook, Smith & Reynolds, P.C.

(57) ABSTRACT

A device comprising a single-sided printed circuit board (PCB) having a non-metallized hole, and a connection area (CA) close to the non-metallized hole on a metallized side of the single-sided printed circuit board. The present invention provides a conducting bridge (CP) from the connection area (CA) and at least partially covering the non-metallized hole, for allowing the connection area (CA) to be contacted, e.g. by a probe (P), from a non-metallized side of the single-sided printed circuit board (PCB) through the non-metallized hole.

2 Claims, 2 Drawing Sheets

(51) Int. Cl.
*H05K 7/00* (2006.01)
*H05K 1/11* (2006.01)
*H05K 1/02* (2006.01)
*H05K 3/36* (2006.01)
*G08C 17/02* (2006.01)

(52) U.S. Cl.
CPC .............. *H05K 2201/0394* (2013.01); *H05K 2201/09063* (2013.01)

(56) References Cited

U.S. PATENT DOCUMENTS

| | | |
|---|---|---|
| 5,883,335 A | 3/1999 | Mizumoto et al. |
| 6,285,081 B1 | 9/2001 | Jackson |
| 6,911,608 B2 * | 6/2005 | Levy .................... H01H 13/702 200/292 |
| 7,391,342 B1 * | 6/2008 | Mui ....................... H03M 11/24 341/22 |
| 7,618,846 B1 | 11/2009 | Pagaila et al. |
| 8,115,108 B2 | 2/2012 | Sakai |
| 8,404,989 B2 * | 3/2013 | Han ..................... H01H 13/702 200/5 A |
| 8,896,743 B2 * | 11/2014 | Du ....................... H04N 5/2257 348/335 |
| 2001/0050566 A1 * | 12/2001 | Hacke .................. G01R 1/0735 324/754.08 |
| 2008/0230362 A1 * | 9/2008 | Hsu ..................... H01H 13/705 200/512 |

FOREIGN PATENT DOCUMENTS

EP          2 991 459 A1     3/2016
WO     WO 2000/11920        3/2000

OTHER PUBLICATIONS

International Search Report and Written Opinion of International Application No. PCT/SG2015/000137 "Device Having a Single-Sided Printed Circuit Board," dated Oct. 6, 2015.

* cited by examiner

DEVICE HAVING A SINGLE-SIDED PRINTED CIRCUIT BOARD

This application is the U.S. National Stage of International Application No. PCT/SG2015/000137, filed Aug. 24, 2015, now published, which designates the U.S., published in English, and claims priority under 35 U.S.C. §§ 119 or 365(c) to European Application No. 14182073.8, filed Aug. 25, 2014, issued on Feb. 2, 2018 as EP 2 991 459 B1. The entire teachings of the above applications are incorporated herein by reference.

FIELD OF THE INVENTION

The invention relates to a device having a single-sided printed circuit board.

BACKGROUND OF THE INVENTION

Single-sided printed circuit boards are known in the art, and have the advantage that they are cheaper than double-sided printed circuit boards. However, the obvious disadvantage of a single-sided printed circuit board is that connections are only possible at one side. While metallized vias or holes through the printed circuit board are known as well, such metallized holes also result in a price increase. For general background information on printed circuit boards (alternatively called printed wiring boards), reference is made to the Wikipedia article at http://en.wikipedia.org/wiki/Printed_wiring_board, incorporated herein by reference.

SUMMARY OF THE INVENTION

It is, inter alia, an object of the invention to provide a relatively low-cost device having a single-sided printed circuit board that can still be contacted from the other side without using a metallized via. The invention is defined by the independent claims. Advantageous embodiments are defined in the dependent claims.

One aspect of the invention provides a device comprising a single-sided printed circuit board having a non-metallized hole, and a connection area close to the non-metallized hole on a metallized side of the single-sided printed circuit board; and a conducting bridge from the connection area and at least partially covering the non-metallized hole, for allowing the connection area to be contacted (e.g. by a probe) from a non-metallized side of the single-sided printed circuit board through the non-metallized hole.

The invention is advantageously applied in a remote control device, in which case the connection bridge can be formed by part of a key-mat having a carbon print area that forms the connection bridge. The probe can be used for testing purposes, or for allowing the IC to be programmed. In a similar way, it is possible to make a reset button at the bottom side of a single-sided printed circuit board if that reset button bridges two connection areas on the wired top side of the printed circuit board via respective connection bridges.

These and other aspects of the invention will be apparent from and elucidated with reference to the embodiments described hereinafter.

DESCRIPTION OF EMBODIMENTS

In the various figures, the reference signs have the following meanings:
TC top casing of the remote control device
KM key-mat
B button on the key-mat
CP carbon print area on the bottom of the key-mat
PCB printed circuit board
CA connection area on the printed circuit board
BC bottom casing of the remote control device
BL battery lid
P probe The figures show various views of a remote control device in accordance with an embodiment of the invention. The embodiment is a rather simple remote control, with buttons B for channel up, channel down, volume up, volume down, and a standby button. Of course, the invention can alternatively be used with remote controls having more buttons. When a button is pressed down, a carbon print area CP on the lower side of the key-mat KM makes a connection on the printed circuit board PCB by bridging two contact areas (in this embodiment, these contact areas are represented by half circles; contact areas having other shapes are alternatively possible). The printed circuit board PCB has several other components customary for a remote control device, such as an integrated circuit and an infra-red light emitting diode.

In accordance with the present embodiment of the invention, there is also a carbon print area CP on the key-mat KM that is not below a button B, but that serves to make a connection between a probe P if and when inserted from the bottom side of the printed circuit board, through a hole in the bottom casing BC and a matching hole in the printed circuit board PCB, to a connection area CA on the top side of the single-sided printed circuit board PCB.

Figure 1A:
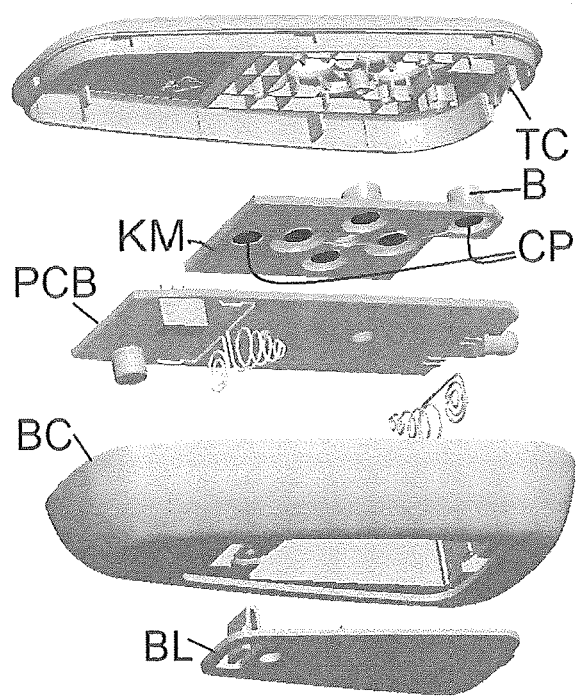
FIGS. 1A and 1B show exploded views of a remote control device in accordance with an embodiment of the invention.
Figure 1B:
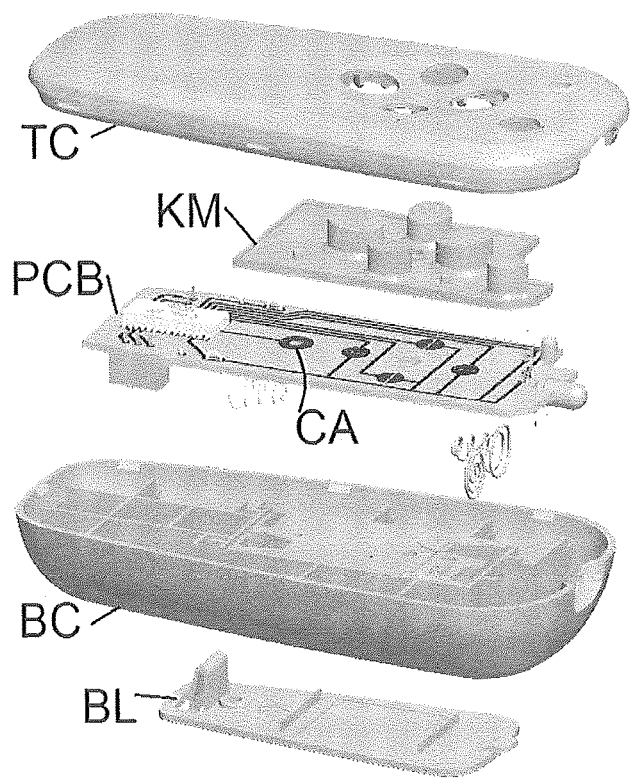
Figure 2:
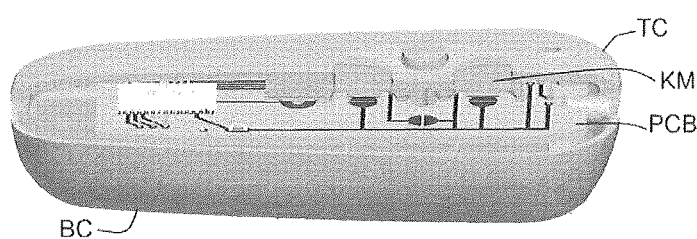
FIGS. 2 and 3 show other views of a remote control device in accordance with an embodiment of the invention.
Figure 3:
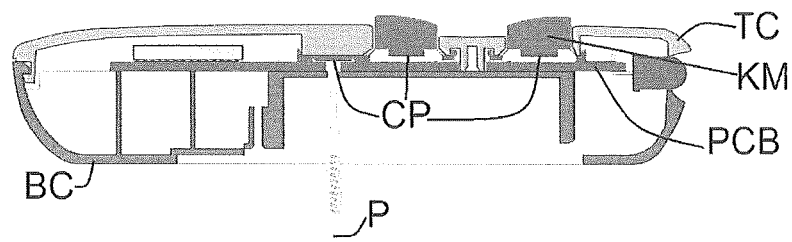

As shown in FIGS. 2 and 3, the top casing TC of the remote control device in accordance with the embodiment of the invention is preferably formed such that the carbon print area above the hole in the printed circuit board PCB is firmly pressed onto the connection area, so that if and when the probe P is inserted through the hole and touches the carbon print, it gets a good connection with the connection area.

It should be noted that the above-mentioned embodiments illustrate rather than limit the invention, and that those skilled in the art will be able to design many alternative embodiments without departing from the scope of the appended claims. In the shown embodiment, the connection area CA is a circle around the hole in the printed circuit board PCB. Alternatively, it may be a metalized area adjacent to just one side of the hole. The carbon print areas CP do not need to have a circle shape, and they do not need to cover the entire hole as long as they ensure that a connection is made between a probe P inserted through the hole and the connection area CA. The bottom side of the key-mat KM may alternatively have metallized contact areas instead of carbon print areas, as all what matters is that an electrical connection can be made so that a conducting bridge is formed. While the invention is illustrated by means of an embodiment formed by a remote control device, the invention can be used with any device having a single side printed circuit board that needs to be contacted from the other side. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements.

The invention claimed is:

1. A remote control device comprising:
   a single-sided printed circuit board (PCB) having a non-metalized hole, and a connection area (CA) adjacent to the non-metalized hole on a metalized side of the single-sided printed circuit board; and
   a conducting bridge from the connection area (CA) and at least partially covering the non-metalized hole, for allowing the connection area (CA) to be contacted by a probe from a non-metalized side of the single-sided printed circuit board (PCB) through the non-metalized hole;
   wherein the PCB,CA and conducting bridge are maintained within a housing in operatively connectable contact without the requirement of an adhesive,
   wherein, upon insertion of the probe through the non-metalized hole, an electrical connection is formed between the probe and the CA through the conducting bridge.

2. The remote control device as claimed in claim 1, further comprising a key-mat (KM) having a carbon print area, and the conducting bridge is formed by said carbon print area.

* * * * *